US012564011B2

(12) United States Patent
Ravi et al.

(10) Patent No.: US 12,564,011 B2
(45) Date of Patent: Feb. 24, 2026

(54) CLEANING WIDE BANDGAP EPITAXIAL SUSCEPTORS AND METHOD THEREFOR

(71) Applicant: ThinSiC Inc, Santa Clara, CA (US)

(72) Inventors: Tirunelveli Subramaniam Ravi, San Jose, CA (US); Ashraf Ahmed Eldakrouri, Santa Clara, CA (US)

(73) Assignee: ThinSiC Inc., Santa Clara, CA (US)

( * ) Notice: Subject to any disclaimer, the term of this patent is extended or adjusted under 35 U.S.C. 154(b) by 422 days.

(21) Appl. No.: 18/105,562

(22) Filed: Feb. 3, 2023

(65) Prior Publication Data

US 2024/0266207 A1     Aug. 8, 2024

(51) Int. Cl.
     *H01L 21/687*       (2006.01)
     *B08B 7/00*         (2006.01)
     *B08B 7/04*         (2006.01)
     *C30B 25/12*      (2006.01)

(52) U.S. Cl.
     CPC ...... *H01L 21/68757* (2013.01); *B08B 7/0035* (2013.01); *B08B 7/0042* (2013.01); *B08B 7/04* (2013.01); *C30B 25/12* (2013.01)

(58) Field of Classification Search
     CPC ....... B08B 7/0042; B08B 7/0035; B08B 7/04; C30B 25/12; C30B 29/36; H01L 21/68757
     See application file for complete search history.

(56) References Cited

U.S. PATENT DOCUMENTS 7,582,166 B2    9/2009   Lampe et al.
8,021,968 B2    9/2011   Nishizawa et al.

D766,850 S      9/2016   Morisaki et al.
11,390,944 B2   7/2022   Harashima et al.
11,479,852 B2   10/2022   Sato et al.
11,495,487 B1   11/2022   Wang
11,501,996 B2   11/2022   Narahara
2012/0031330 A1*   2/2012   Tsumori .................. C23C 16/32
                                          118/712
2016/0172215 A1*   6/2016   Kim .......................... B05D 7/50
                                          427/140
2019/0194803 A1    6/2019   Kato

FOREIGN PATENT DOCUMENTS

KR            100441294 B1 *   7/2004    ............... B08B 3/12

* cited by examiner

*Primary Examiner* — Steven W Crabb
*Assistant Examiner* — Dilnessa B Belay

(57)                 ABSTRACT

A susceptor configured to hold one or more WBG (Wide Bandgap) semiconductor wafers for epitaxial layer growth to support a manufacture of at least one WBG semiconductor device. A susceptor is removed from an epitaxial reactor when a predetermined thickness of polycrystalline WBG semiconductor material builds up from growing epitaxial layers on one or more WBG semiconductor wafers. The susceptor is scanned by a laser such that the energy from the laser is absorbed by the one or more layers of polycrystalline WBG semiconductor material to decompose the one or more layers of polycrystalline WBG semiconductor material into two or more constituent components. The two or more constituent components are then removed from the susceptor by etching to produce a cleaned susceptor. The cleaned susceptor can then be placed in an epitaxial reactor to grow epitaxial wafers on WBG semiconductor wafers.

18 Claims, 14 Drawing Sheets

120

230

220

210

CLEANING WIDE BANDGAP EPITAXIAL SUSCEPTORS AND METHOD THEREFOR

FIELD

This invention relates to semiconductor device manufacture, and in particular to maintaining epitaxial susceptors for optimal epitaxial growth.

BACKGROUND

The use of wide bandgap (WBG) semiconductors has increased dramatically in recent years in power electronics. The ability of WBG semiconductors to operate efficiently at higher voltages, powers, temperatures, and switching frequencies has reduced cooling requirements, lowered part counts, and minimized the number of passive components needed. WBG power electronics can further reduce the footprint and system cost of various renewable energy electrical equipment such as motor drivers and inverters.

Among the WBG semiconductors for power electronics, Silicon Carbide (SIC) has been increasingly used for high voltage drivers (>1200V) whereas Gallium Nitride (GaN) has been established for use in both higher power and higher frequency applications. From a WBG substrate perspective, 4H-Silicon carbide (SiC) Single Crystal Substrates have been used for both SiC and GaN devices since SiC and GaN epitaxial layers can be grown with reduced defects on SiC substrates. The GaN substrate, on the other hand, is very expensive to grow defect free and has not kept up with scaling size increases afforded with SiC substrates. While the SiC substrate quality has dramatically improved in the recent years, the cost has not come down since substrate fabrication is a complex process starting with vapor phase ingot growth followed by ingot cropping, then wire sawing of individual wafers, and finally grinding and polishing of the substrate, and as of now, there has been no proven practical method to eliminate any of these foregoing steps.

One cost associated with WBG epitaxial growth is the use of susceptors. WBG wafers are placed on a susceptor to grow one or more epitaxial layers in which WBG semiconductor devices are formed. Typically, the thickness of an epitaxial layer corresponds to the breakdown voltage of the device. Although the epitaxial process grows the WBG material on a wafer or wafers, it will also form a WBG polycrystalline layer overlying the susceptor that holds the wafer or wafers during the process. With each wafer processed the WBG polycrystalline layer on the susceptor increases in thickness. At some point, the WBG polycrystalline layer affects WBG epitaxial growth and will introduce defects in the epitaxy due particle contamination. In general, the susceptor is removed from further processing prior to particle contamination occurring. It should be noted that susceptors are extremely expensive which adds cost to the manufacture of WBG semiconductor devices.

Refurbishment of susceptors has been tried but has yielded less than desirable results. For example, the WBG polycrystalline layer can be removed by scraping. The results are often non-uniform and can leave scratches in the TaC (Tantalum Carbide) overlying the surface of the susceptor. Scratches in the surface of the susceptor are problematic and can lead to defectivity in WBG epitaxial growth. Alternatively, the WBG polycrystalline layer on the susceptor can be removed chemically using ClF3 (chlorine trifluoride). ClF3 is extremely dangerous and is highly corrosive. The use of ClF3 requires special safety equipment. Also, ClF3 can attack and remove or partially remove the TaC layer on the susceptor unless the process is extremely well controlled. Moreover, the use of ClF3 may necessitate a special coating to protect the TaC coating overlying the susceptor surface adding further cost. Although less expensive than a new susceptor the refurbished susceptor each introduce their own problems in manufacture, cost, or reliability.

As a semiconductor substrate for WBG semiconductors are being produced to form devices that use high currents, defects will play a larger role. Moreover, the importance of low defectivity WBG epitaxial layers as die size increase will support reduced yield loss and improved reliability. Therefore, to maximize die yield, any cost reduction activity regarding the substrate and epitaxial growth is paramount. Similarly, improving the electrical characteristics of the device formed in the WBG epitaxial layer(s) in conjunction with lowering fabrication costs will support integration into systems where they were not considered due to cost or performance.

Accordingly, it is desirable to provide a system that lowers wafer processing costs while improving device performance to enable new uses for high power high efficiency semiconductor devices.

BRIEF DESCRIPTION OF THE DRAWINGS

Various features of the system are set forth with particularity in the appended claims. The embodiments herein, can be understood by reference to the following description, taken in conjunction with the accompanying drawings, in which:

DETAILED DESCRIPTION

Figure 1:
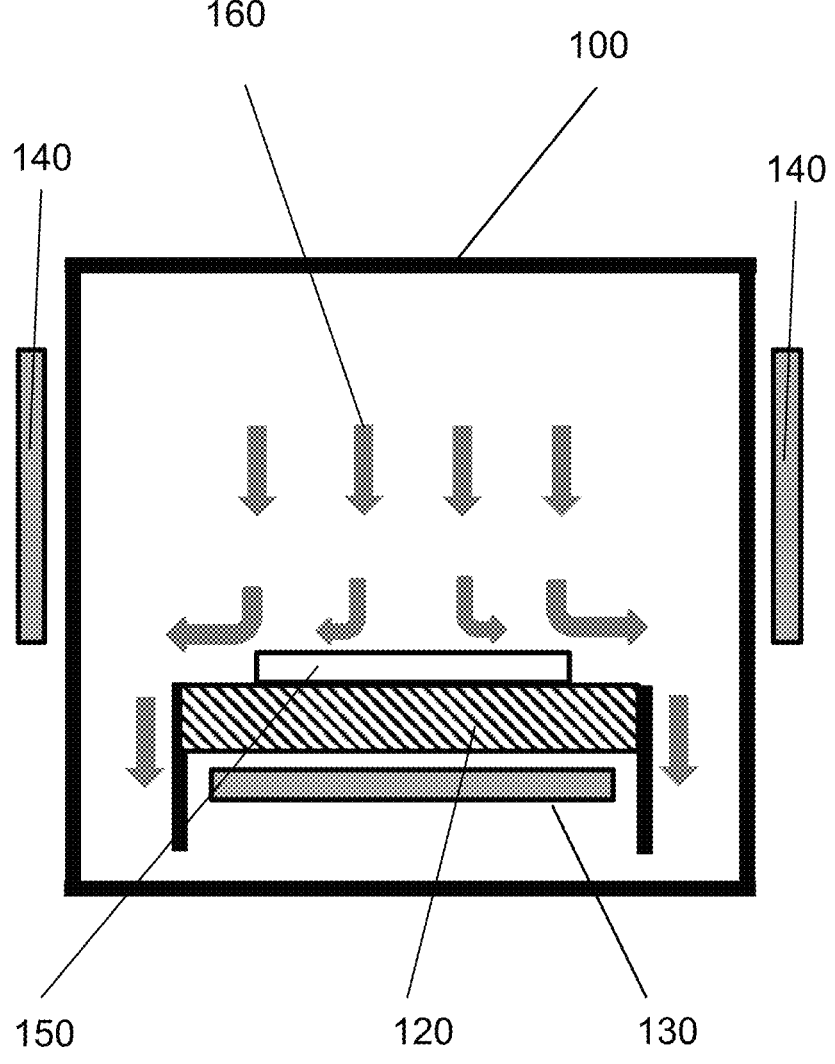
FIG. 1 is an illustration of an epitaxial reactor used for the deposition of wide band gap (WBG) semiconductor on a wide band (WBG) wafer in accordance with an example embodiment.

The following description of embodiment(s) is merely illustrative in nature and is in no way intended to limit the invention, its application, or uses.

For simplicity and clarity of the illustration(s), elements in the figures are not necessarily to scale, are only schematic, are non-limiting, and the same reference numbers in different figures denote the same elements, unless stated otherwise. Additionally, descriptions and details of well-known steps and elements are omitted for simplicity of the description. Notice that once an item is defined in one figure, it may not be discussed or further defined in the following figures.

The terms "first", "second", "third" and the like in the Claims or/and in the Detailed Description are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Processes, techniques, apparatus, and materials as known by one of ordinary skill in the art may not be discussed in detail but are intended to be part of the enabling description where appropriate.

While the specification concludes with claims defining the features of the invention that are regarded as novel, it is believed that the invention will be better understood from a consideration of the following description in conjunction with the drawing figures, in which like reference numerals are carried forward.

The current invention is described with an example embodiment for cleaning a susceptor for an epitaxial reactor for wide band gap (WBG) semiconductor materials. A method for optical cleaning and refurbishing of susceptors used for epitaxial growth of WBG semiconductor materials on WBG semiconductor wafers using an epitaxial reactor is described with an example embodiment. FIG. 1 is an illustration of an epitaxial reactor 100 for the deposition of wide band gap (WBG) semiconductor on wide band gap (WBG) wafers in accordance with an example embodiment. Epitaxial reactor 100 may be used for the growth of WBG semiconductor material such as silicon carbide, gallium nitride, among others on semiconductor wafers which are subsequently used for fabrication of semiconductor devices. In an example embodiment, WBG semiconductor material is formed on a WBG semiconductor wafer 150 using epitaxial growth in epitaxial reactor 100. In one embodiment, WBG semiconductor material is silicon carbide (SiC) grown on WBG semiconductor wafer 150 that comprises silicon carbide. In an example embodiment, epitaxial reactor 100 comprises a chamber containing susceptor 120 for supporting or holding WBG semiconductor wafer 150. In one embodiment, susceptor 120 acts as a carrier for WBG semiconductor wafer 150 during the epitaxial growth process. Susceptor 120 with WBG semiconductor wafer 150 is exposed to process gases 160 at high temperatures. In one embodiment, the high temperatures within epitaxial reactor 100 are generated using heaters. Susceptor 120 may be heated using bottom heater 130, placed below susceptor 120 and wall heaters 140 placed on vertical walls of epitaxial reactor 100. In an example embodiment, WBG semiconductor wafers 150 comprises one or more silicon carbide wafers and is exposed to process gases 160 comprising TCS (Tri Chloro Silane) and propane for the epitaxial growth of silicon carbide at temperatures of (1600-1800)° C. using bottom heater 130 placed below susceptor 120 and wall heaters 140 within epitaxial reactor 100. Susceptor 120 is rotated during the epitaxial growth process to ensure a uniform thickness of epitaxial grown layer on WBG semiconductor wafer 150. As previously mentioned, susceptor 120 can hold more than one wafers to support epitaxial growth on the more than one wafers simultaneously within epitaxial reactor 100. Dopants gases may be added during the epitaxial growth process to form the epitaxial layer overlying WBG semiconductor wafer 150. The thickness of the epitaxial layer formed overlying WBG semiconductor wafer 150 is determined by the semiconductor device fabricated during subsequent fabrication process steps. One or more epitaxial layers may be formed overlying WBG semiconductor wafer 150. After the formation of the one or more epitaxial layers overlying WBG semiconductor wafer 150, it is removed from epitaxial reactor 100 and used to manufacture WBG semiconductor devices. In one embodiment, Schottky Barrier Diodes, MOSFETs, or Trench MOSFETs or other semiconductor devices are formed using WBG semiconductor wafer 150 comprising silicon carbide wafer 150 and the one or more silicon carbide epitaxial layers formed using epitaxial reactor 100.

Figure 2:
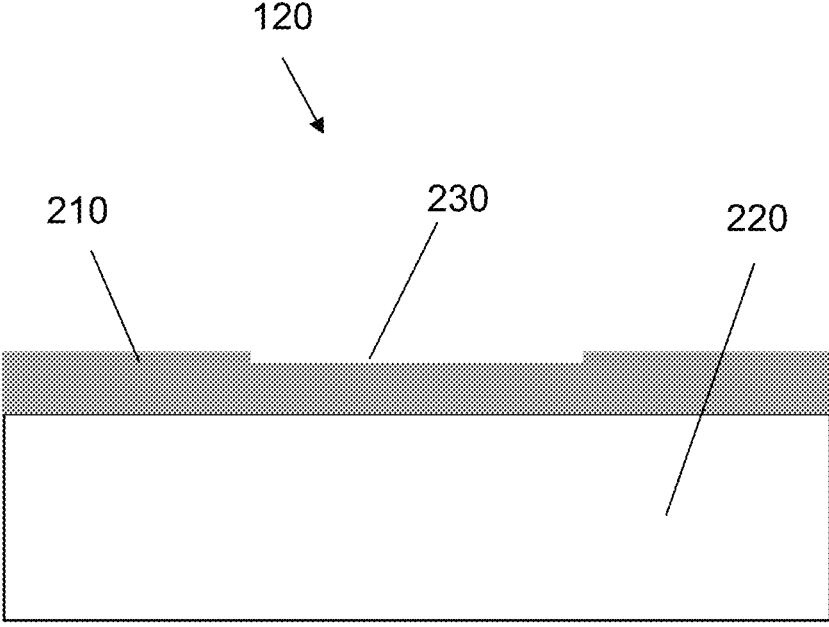
FIG. 2 is an illustration of the susceptor used in the epitaxial reactor for epitaxial growth of WBG semiconductor material on the WBG semiconductor wafer in accordance with an example embodiment.

FIG. 2 is an illustration of susceptor 120 used in epitaxial reactor 100 for the epitaxial growth of WBG semiconductor materials overlying WBG semiconductor wafer 150 in accordance with an example embodiment. In an example embodiment, susceptor 120 is comprised of carrier 220 coated with a protective layer 210 that is a coating that protects susceptor 120 during the epitaxial growth process. In one embodiment, susceptor 120 comprises graphite and protective layer 210 comprises Tantalum Carbide (TaC). In one embodiment, protective layer 210 has a recessed region forming a wafer pocket 230 in which WBG semiconductor wafer 150 of FIG. 1 is placed during the epitaxial growth process.

Figure 3:
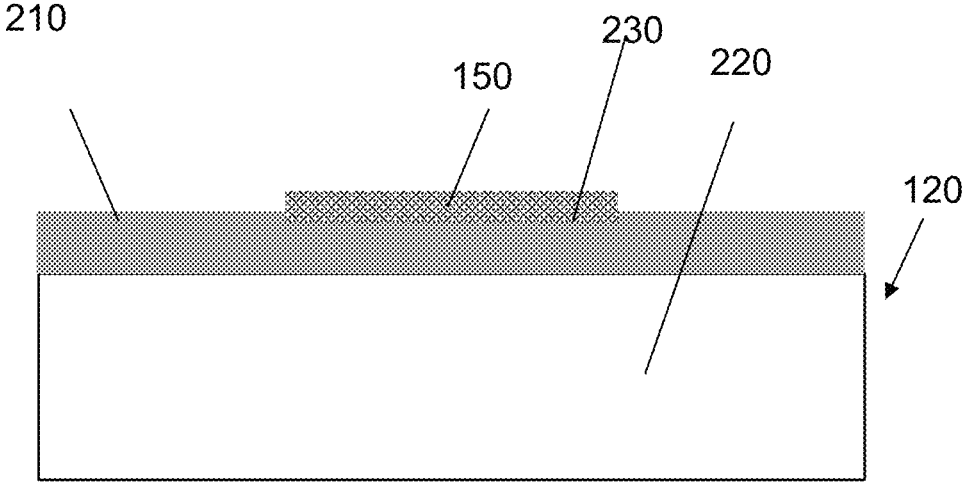
FIG. 3 is an illustration of the susceptor with the WBG semiconductor wafer placed in the wafer pocket of the susceptor in accordance with an example embodiment.

FIG. 3 is an illustration of susceptor 120 with WBG semiconductor wafer 150 placed in wafer pocket 230 prior to placement inside epitaxial reactor 100 of FIG. 1 for WBG semiconductor material growth using epitaxial processes in accordance with an example embodiment. In one embodiment, WBG semiconductor wafer 150 comprises silicon carbide and WBG semiconductor material grown using epitaxial growth process also comprises silicon carbide.

Figure 4:
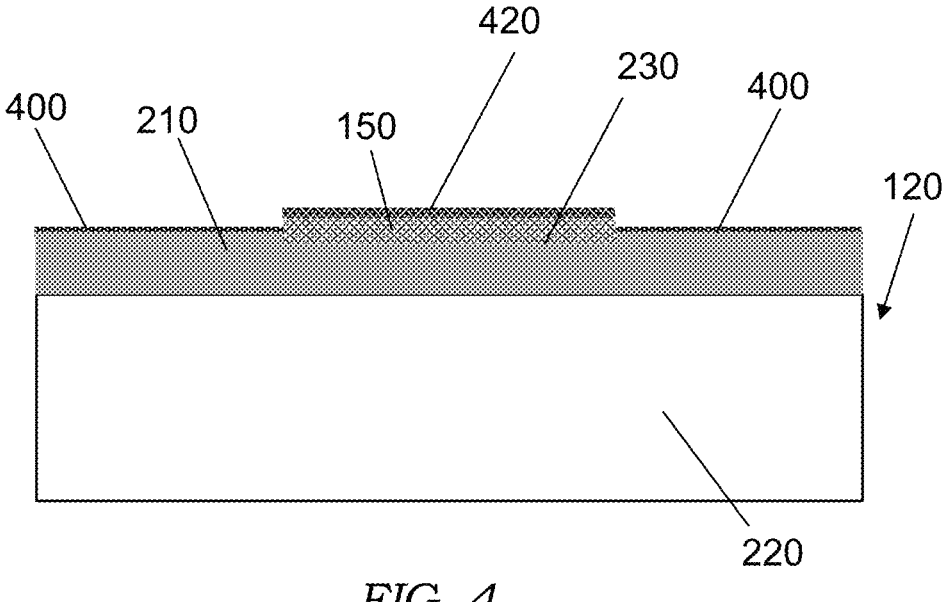
FIG. 4 is an illustration of the susceptor with the WBG semiconductor wafer after epitaxial growth of WBG semiconductor material in the epitaxial reactor in accordance with an example embodiment.

FIG. 4 is an illustration of susceptor 120 with WBG semiconductor wafer 150 placed in wafer pocket 230 after WBG epitaxial layer growth in accordance with an example embodiment. In the epitaxial growth process, a single crystalline epitaxial layer 420 is formed overlying WBG semiconductor wafer 150. The epitaxial growth process in epitaxial reactor 100 of FIG. 1 also forms a layer of polycrystalline WBG semiconductor material 400 overlying protective layer 210 of susceptor 120. Polycrystalline WBG semiconductor material 400 overlying protective layer 210 may comprise of one or more layers of polycrystalline WBG semiconductor material 400 after one or more depositions of WBG semiconductor material in epitaxial reactor 100 of FIG. 1. The one or more depositions may comprise epitaxial growth on WBG semiconductor wafer 150 or epitaxial growth on more than one WBG semiconductor wafer as susceptor 120 is removed from the epitaxial reactor 100 of FIG. 1 and a new WBG semiconductor wafer is placed in susceptor 120 for growing an epitaxial layer within epitaxial reactor 100. Note that in either case, polycrystalline WBG semiconductor material 400 will increase in height with each epitaxial growth process performed.

As previously mentioned the epitaxial growth process also forms single crystalline epitaxial layer 420 of WBG semiconductor material overlying WBG semiconductor wafer 150. In one embodiment, polycrystalline WBG semiconductor material 400 overlying protective layer 210 comprises polycrystalline silicon carbide. In one embodiment, single crystalline epitaxial layer 420 of WBG semiconductor material overlying WBG semiconductor wafer 150 comprises single crystal silicon carbide.

Figure 5:
FIG. 5 is an illustration of the susceptor after removal of the WBG semiconductor wafer from the wafer pocket after epitaxial growth of the WBG semiconductor material in the epitaxial reactor in accordance with an example embodiment.
Figure 5:
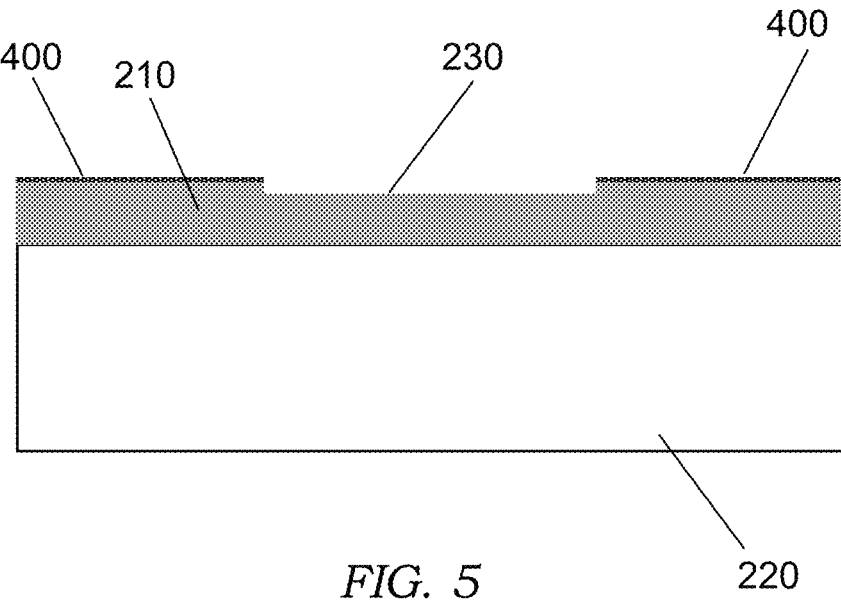

FIG. 5 is an illustration of susceptor 120 after removal of WBG semiconductor wafer 150 from wafer pocket 230 after WBG epitaxial layer growth in accordance with an example embodiment. In the example, after completing the epitaxial growth process, WBG semiconductor wafer 150 of FIG. 4 having single crystalline epitaxial layer 420 formed thereon is removed from epitaxial reactor 100 of FIG. 1. One or more layers of polycrystalline WBG semiconductor material 400 overlying protective layer 210 may have formed on susceptor 120 during one or more epitaxial growth processes performed using susceptor 120 in epitaxial reactor 100 of FIG. 1. In one embodiment, the one or more layers of polycrystalline WBG semiconductor material 400 overlies protective layer 210 of susceptor 120 but not on carrier 220. The thickness of polycrystalline WBG semiconductor material 400 overlying protective layer 210 depends on the epitaxial growth process and the number of times susceptor 120 is used to grow single crystalline epitaxial layers on more than one WBG semiconductor wafers within epitaxial reactor 100 of FIG. 1.

Figure 6:
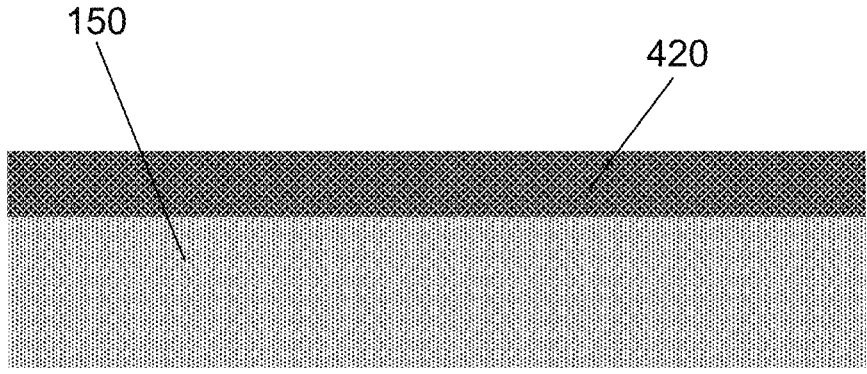
FIG. 6 is an illustration of the WBG semiconductor wafer with an overlying single crystalline epitaxial layer after removal from the epitaxial reactor in accordance with an example embodiment.

FIG. 6 is an illustration of WBG semiconductor wafer 150 with an overlying single crystalline epitaxial layer 420 after removal from epitaxial reactor 100 of FIG. 1 in accordance with an example embodiment. In one embodiment, WBG semiconductor wafer 150 can have one or more single crystalline epitaxial layers. In the example embodiment, WBG semiconductor wafer 150 has one single crystalline epitaxial layer 420 formed to a predetermined height. The predetermined height of the single crystalline epitaxial layer 420 is determined by the type of semiconductor device being formed. Single crystalline epitaxial layer 420 is used for the fabrication of WBG semiconductor device using techniques well known to those skilled in the art. In one embodiment, WBG semiconductor wafer 150 comprises silicon carbide.

In one embodiment, single crystalline epitaxial layer 420 comprises single crystalline silicon carbide formed through the epitaxial growth process.

Figure 7:
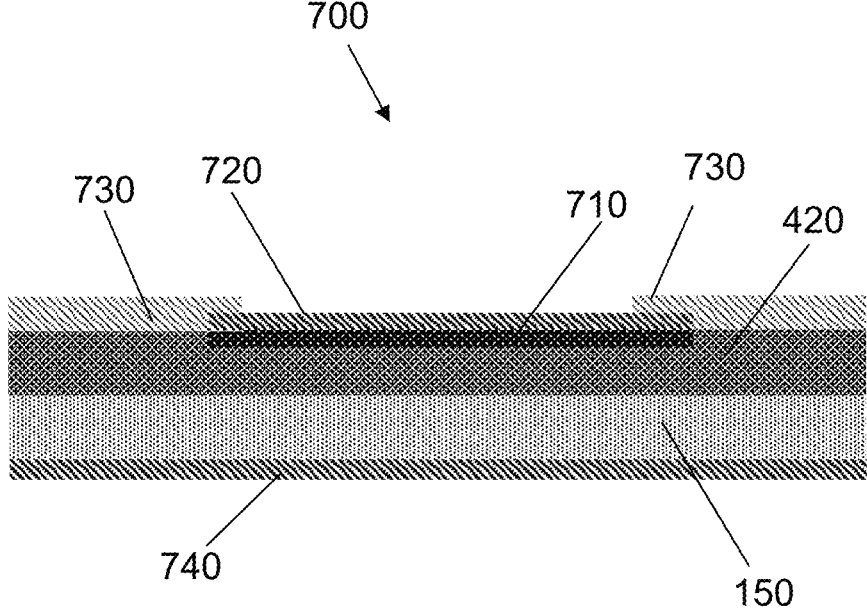
FIG. 7 is an illustration of a WBG semiconductor device fabricated overlying the WBG semiconductor wafer with the overlying single crystalline epitaxial layer in accordance with an example embodiment.

FIG. 7 is an illustration of a WBG semiconductor device 700 fabricated using WBG semiconductor wafer 150 with the overlying single crystalline epitaxial layer 420 in accordance with an example embodiment. In an example embodiment, WBG semiconductor device 700 fabricated using WBG semiconductor wafer 150 with overlying single crystalline epitaxial layer 420 comprises a silicon carbide Schottky Barrier Diode (SBD). In one embodiment, WBG semiconductor device 700 comprises a heavily doped region 710 in single crystalline epitaxial layer 420. Contact to one electrode of the SBD is made using a patterned metal electrode 720 which is protected with a patterned insulating layer 730. Contact to the second electrode of the SBD is made with a back metal layer 740 overlying a surface of WBG semiconductor wafer 150 with an overlying single crystalline epitaxial layer 420. The thickness of WBG semiconductor wafer 150 may be reduced by grinding prior to formation of back metal layer 740. The detailed process steps for fabrication of SBD using WBG semiconductor wafer 150 with an overlying single crystalline epitaxial layer 420 is well known to those skilled in the art. In general, more than one device is formed on or in single crystalline epitaxial layer 420. The one or more devices are typically separated by a dicing grid to separate the devices after fabrication as is well known to one skilled in the art.

Figure 8:
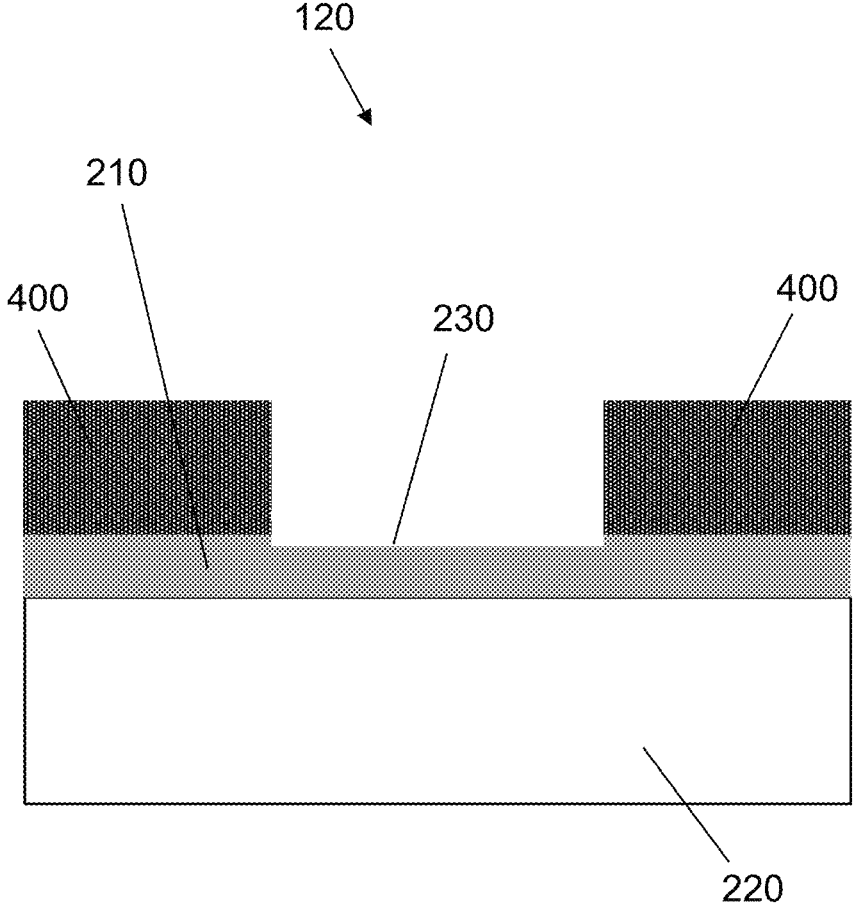
FIG. 8 is an illustration of the susceptor after multiple runs of the epitaxial growth process in the epitaxial reactor in accordance with an example embodiment.

FIG. 8 is an illustration of susceptor 120 after multiple runs of WBG epitaxial layer growth in epitaxial reactor 100 of FIG. 1 in accordance with an example embodiment. In general, wafers are placed on susceptor 120 to grow one or more single crystalline epitaxial layers on each wafer within epitaxial reactor 100 of FIG. 1. Multiple layers of polycrystalline WBG semiconductor material 400 build up over time with each wafer processed within epitaxial reactor 100 of FIG. 1. Polycrystalline WBG semiconductor material 400 overlies protective layer 210 of susceptor 120. In the example embodiment, the layers of polycrystalline WBG semiconductor material 400 overlying protective layer 210 comprises multiple layers of polycrystalline silicon carbide. In one embodiment, the thickness of polycrystalline WBG semiconductor material 400 overlying protective layer 210 comprising multiple layers of polycrystalline silicon carbide may be (150-350) micrometers before susceptor 120 is removed from service. Susceptor 120 is removed from epitaxial reactor 100 of FIG. 1 when the thickness of one or more layers of polycrystalline WBG semiconductor material 400 is above or equal to a predetermined thickness. The predetermined thickness for removal of susceptor 120 from the epitaxial growth process such as 150-350 micrometers of polycrystalline WBG material is chosen to prevent yield loss or defects in subsequent wafers processed within epitaxial reactor 100. In the example embodiment, susceptor 120 is cleaned to remove polycrystalline WBG material build up before being used again in epitaxial reactor 100. A system to detect a height of the polycrystalline WBG semiconductor material buildup can be used to indicate when susceptor 120 should be removed from epitaxial reactor 100 of FIG. 1.

Figure 9:
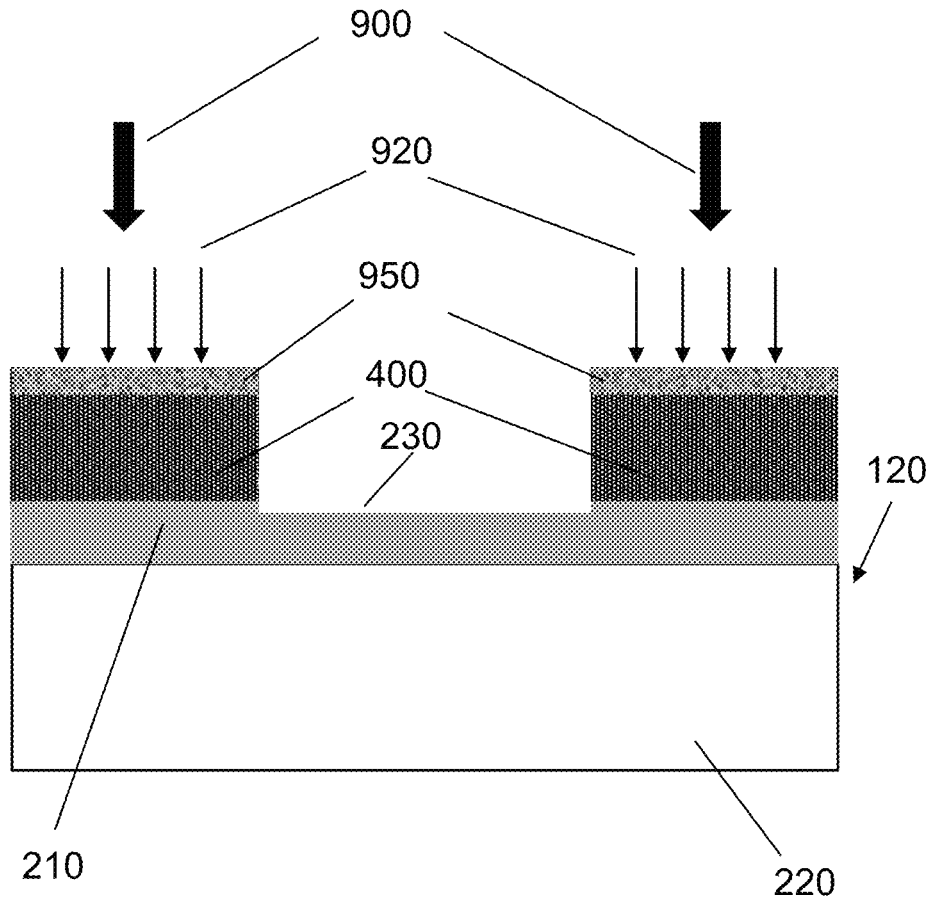
FIG. 9 is an illustration of the susceptor with one or more layers of polycrystalline WBG semiconductor material after being scanned with a laser in accordance with an example embodiment.

FIG. 9 is an illustration of susceptor 120 after being scanned by a laser 900 in accordance with an example embodiment. Laser 900 is configured to scan one or more layers of polycrystalline WBG semiconductor material 400 overlying portions of protective layer 210 of susceptor 120. Laser beam 920 is configured to decompose polycrystalline WBG semiconductor material 400. In one embodiment, laser beam 920 is configured to decompose polycrystalline WBG semiconductor material 400 into decomposed polycrystalline WBG semiconductor layer 950. In the example embodiment, polycrystalline WBG semiconductor material 400 comprises silicon carbide. In one embodiment, laser 900 scans one or more layers of polycrystalline WBG material 400 imparting energy to polycrystalline WBG material 400 to decompose a polycrystalline WBG semiconductor layer 950 into silicon and carbon. The wavelength of laser beam 920 emitted by laser 900 is determined by the material of one or more layers of polycrystalline WBG semiconductor material 400 overlying portions of protective layer 210 of susceptor 120. In the example embodiment, the wavelength of laser beam 920 emitted by laser 900 is 1064 nm to decompose one or more layers of polycrystalline WBG semiconductor material 400 comprising silicon carbide. In general, the wavelength of laser 900 is selected to be absorbed by the one or more layers of polycrystalline WBG semiconductor material 400 to maximize decomposition. The thickness of decomposed polycrystalline WBG semiconductor layer 950 depends on the power and wavelength of laser 900, scan speed and spot size of laser beam 920 among other parameters. In one embodiment, laser 900 used to scan the more or more layers of polycrystalline WBG semiconductor material 400 may be a pulsed laser or continuous mode laser. In one embodiment, laser 900 is a pulsed laser. In the preferred embodiment, laser 900 has a wavelength of 1064 nm for polycrystalline WBG semiconductor material 400 being polycrystalline silicon carbide. Alternatively, laser 900 can be chosen to be any wavelength that is substantially absorbed by the silicon carbide, for example a wavelength of 1950 nm. In one embodiment, a pulsed laser can be configured to provide sufficient energy for decomposition. In one embodiment, providing too much energy to the polycrystalline WBG semiconductor material 400 may not be desirable.

In the example, laser 900 is configured to be absorbed by the polycrystalline WBG semiconductor material 400 to be decomposed into constituent components. As disclosed this process works for polycrystalline silicon carbide. Alternatively, for other WBG materials, the process is similar but the mechanism for removal may differ. For example, a WBG semiconductor material such as GaN will decompose into Gallium and Nitrogen when scanned by laser 900. In one embodiment, the Nitrogen is a gas leaving the Gallium. The remaining Gallium is configured to be removed by a chemical process or alternative approach. In general, energy from laser 900 is configured to be absorbed by polycrystalline WBG semiconductor material 400 to be converted to another form that can be readily removed from susceptor 120 to provide a cleaned susceptor 120.

Figure 10:
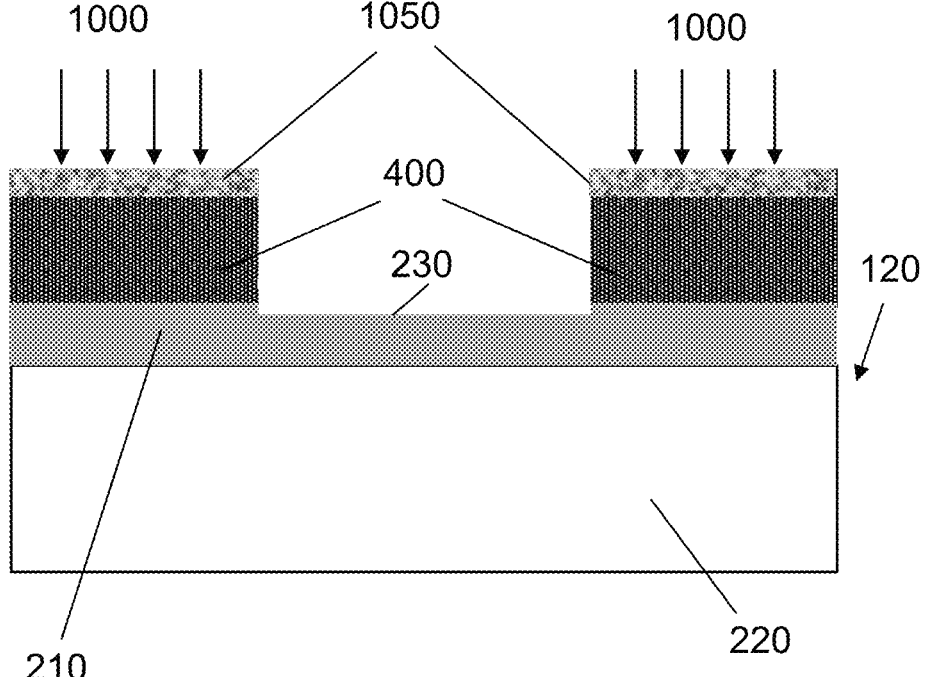
FIG. 10 is an illustration of the susceptor with one or more layers of polycrystalline WBG semiconductor material being placed in a plasma chamber in accordance with an example embodiment.

FIG. 10 is an illustration of susceptor 120 being placed in a plasma chamber in accordance with an example embodiment. In one embodiment, susceptor 120 is exposed to a plasma 1000 within the plasma chamber. Plasma 1000 couples to decomposed polycrystalline WBG semiconductor layer 950 of FIG. 9. In one embodiment, susceptor 120 is placed in the plasma chamber after scanning polycrystalline WBG semiconductor layer 400 with laser 900 to form the one or more layers of decomposed polycrystalline WBG semiconductor layer 950 of FIG. 9. Susceptor 120 is placed in the plasma chamber with reactive gases to remove one or more constituent materials of decomposed polycrystalline WBG semiconductor layer 950 of FIG. 9 to leave residual layer 1050. In the example embodiment, polycrystalline WBG semiconductor layer 400 comprises silicon carbide. As previously mentioned decomposed polycrystalline WBG semiconductor layer 950 of FIG. 9 comprises silicon and carbon after scanning with laser 900. In one embodiment, plasma 1000 comprises oxygen plasma which etches carbon of decomposed polycrystalline WBG semiconductor layer 950 of FIG. 9 leaving residual layer 1050 of silicon. Alternatively, plasma 1000 can comprise oxygen and argon, among other reactive gases used in plasma 1000 to etch the carbon. Alternatively, the plasma chamber configured for delivering plasma 1000 can be replaced with a dry ashing process to remove the carbon.

Figure 11:
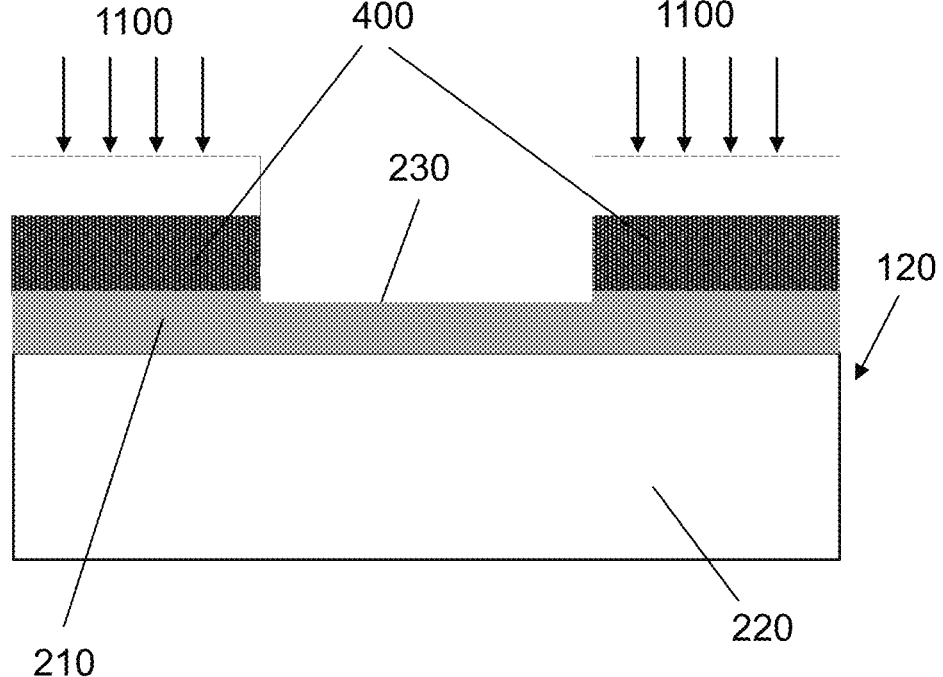
FIG. 11 is an illustration of the susceptor removing the residual layer of FIG. 10 using a reactive plasma in accordance with an example embodiment.

FIG. 11 is an illustration of susceptor 120 removing residual layer 1050 of FIG. 10 in accordance with an example embodiment. In one embodiment, susceptor 120 from FIG. 10 with residual layer 1050 of FIG. 10 is placed in a plasma chamber where it is exposed to reactive plasma 1100 which removes residual layer 1050 of FIG. 10. In one embodiment, the plasma chamber of FIG. 10 differs from the plasma chamber of FIG. 11. Removing residual layer 1050 of FIG. 10 using reactive plasma 1100 reduces the thickness of one or more layers of polycrystalline WBG semiconductor material 400 overlying protective layer 210 of susceptor 120. In one embodiment, the one or more layers of polycrystalline WBG semiconductor material 400 comprises silicon carbide and residual layer 1050 of FIG. 10 comprises silicon. In one embodiment, residual layer 1050 of FIG. 10 comprising silicon is etched using reactive plasma 1100 comprising SF6 (sulfur hexafluoride). Other gases used for reactive plasma 1100 may comprise fluorine or chlorine chemistries used to etch silicon. In another embodiment, residual layer 1050 of FIG. 10 comprising silicon may be etched using a wet chemistry such as KOH (potassium hydroxide), TMAH (Tetra Methyl Ammonium Hydroxide), acetic acid/nitric acid among other wet chemistries used to etch silicon. Alternatively, the plasma chamber configured for delivering plasma 1100 can be replaced with a wet cleaning process for removing silicon. For example, HF (Hydroflouric Acid) and HNO3 (Nitric Acid) can be configured to remove the silicon.

Figure 12:
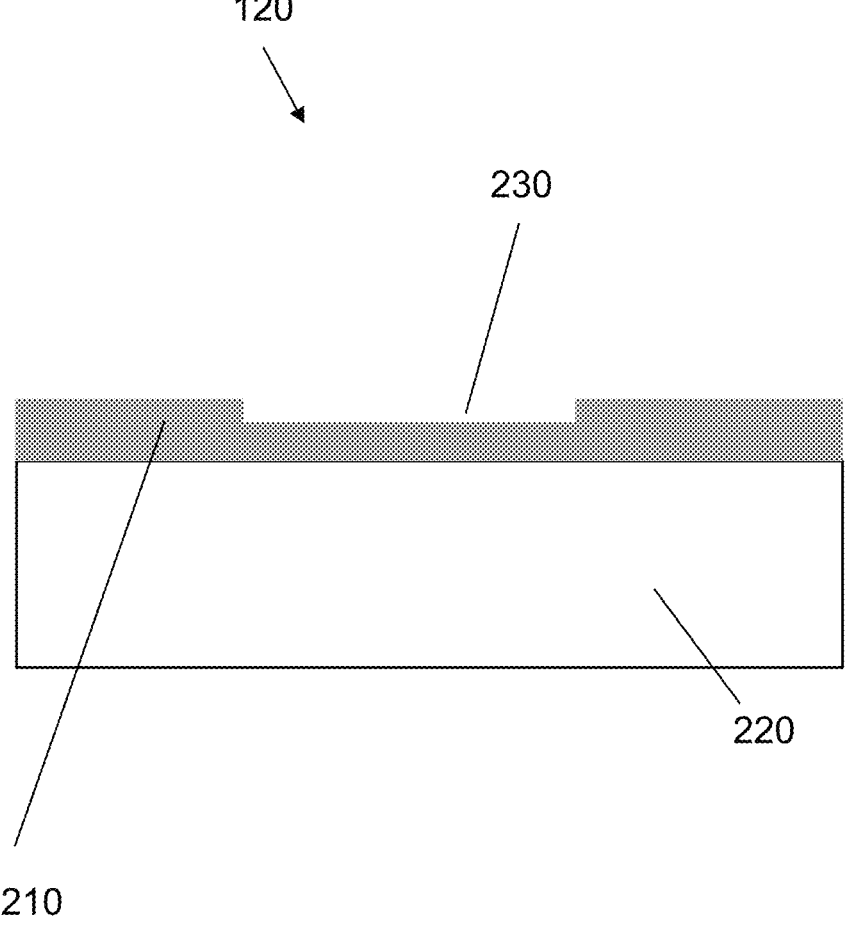
FIG. 12 is an illustration of the susceptor after cleaning the one or more layers of polycrystalline WBG semiconductor material in accordance with an example embodiment.

FIG. 12 is an illustration of susceptor 120 after multiple cycles of decomposing polycrystalline WBG semiconductor material 400 of FIG. 9 and removing constituent materials from the decomposition in accordance with an example embodiment. In one embodiment, each laser cycle further decomposes polycrystalline WBG semiconductor material 400 to form polycrystalline WBG semiconductor layer 950 comprising the decomposed constituent materials. In one embodiment, plasma 1000 of FIG. 10 couples to polycrystalline WBG semiconductor layer 950 of FIG. 9 to remove at least one constituent material. Similarly, plasma 1100 of FIG. 11 is coupled to polycrystalline WBG semiconductor layer 950 of FIG. 9 to remove at least a second constituent material. A number of cycles are performed of scanning with laser 900 of FIG. 9, plasma etching using plasma 1000 of FIG. 10, forming residual layer 1050 of FIG. 10, and etching of residual layer 1050 of FIG. 10 with reactive plasma 1100 of FIG. 11 until the one or more layers of polycrystalline WBG semiconductor material 400 of FIG. 4 is all removed from susceptor 120. This method of cleaning susceptor 120 using processes described in FIGS. 9-11 enables susceptor 120 to be refurbished and the cleaned susceptor 120 placed back into epitaxial reactor 100 so that it can be used for repeated growth of single crystalline epitaxial layers on one or more WBG wafers until the polycrystalline WBG semiconductor layer formed on susceptor 120 reaches the predetermined height where it should be removed for cleaning. This method of optical cleaning of susceptor 120 using optical energy from laser 900 of FIG. 9 described in FIGS. 1-12 enables repeated use of susceptor 120 for epitaxial growth of WBG semiconductor material on WBG semiconductor wafer 150 of FIG. 1 in epitaxial reactor 100 of FIG. 1.

Figure 13:
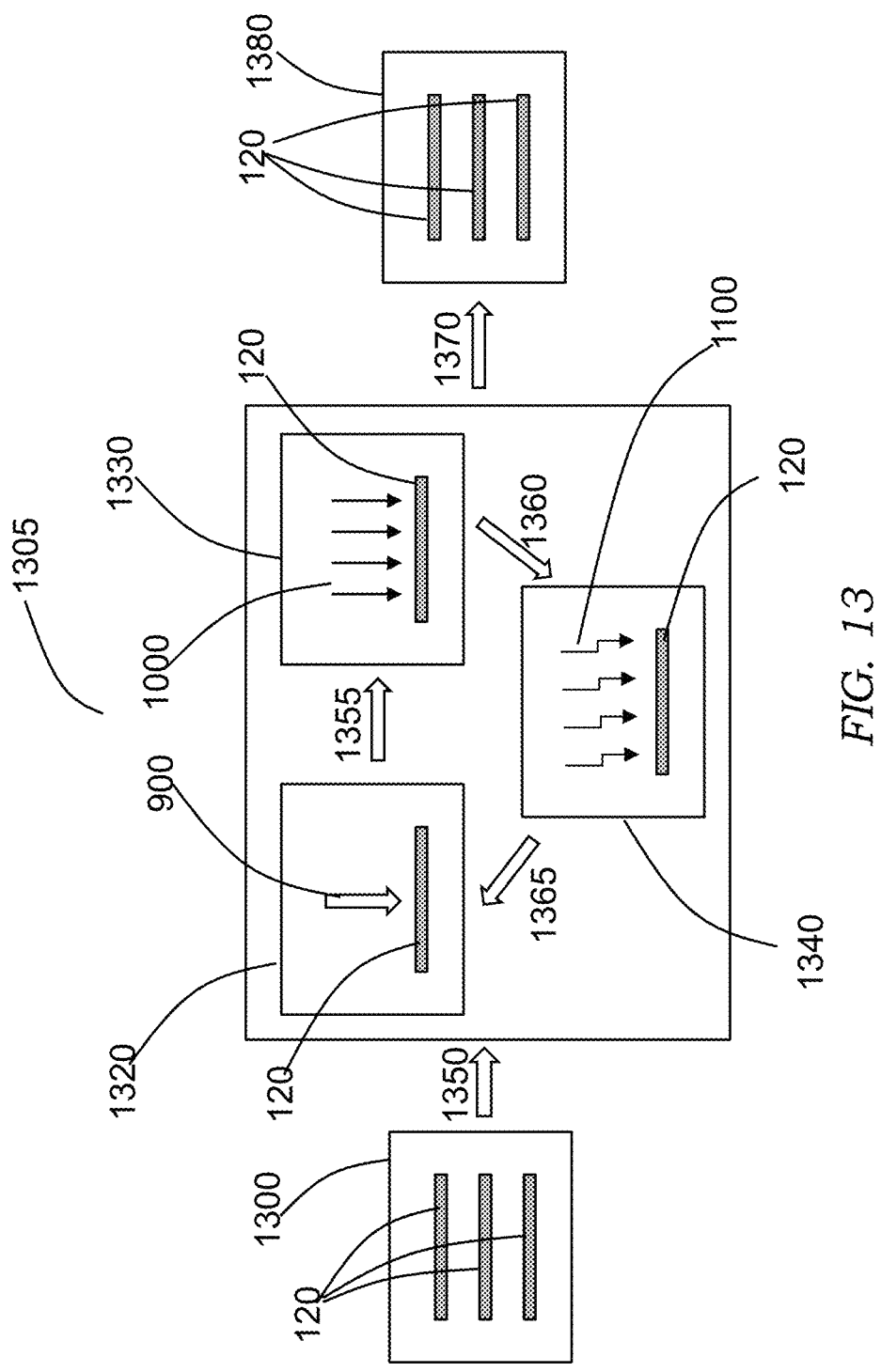
FIG. 13 is an illustration of a susceptor refurbishing system for cleaning susceptors each having a buildup of polycrystalline WBG semiconductor material 400 of FIG. 8 in accordance with an example embodiment.

FIG. 13 is an illustration of a susceptor refurbishing system 1305 using the optical cleaning method described in FIGS. 1-12 in accordance with an example embodiment. Susceptors 120 are unloaded from one or more epitaxial reactors 100 of FIG. 1 after the predetermined thickness of polycrystalline WBG semiconductor material 400 overlying protective layer 210 of FIG. 4 is exceeded. In the example, susceptor refurbishing system 1305 includes a loading unit 1300. Susceptors 120 are placed within loading unit 1300. As mentioned, each susceptor 120 in loading unit 1300 has the growth of one or more layers of polycrystalline WBG semiconductor material that needs to be removed as disclosed in FIGS. 1-12. Susceptors 120 in loading unit 1300 are refurbished by cleaning using repeated cycles of laser scanning, plasma ashing, and plasma etching as described in detail in FIGS. 1-12.

In one embodiment, susceptor refurbishing system 1305 comprises separate modules for cleaning of susceptors 120 each coated with one or more layers of polycrystalline WBG semiconductor material 400 as shown in FIG. 4. In one embodiment, susceptor cleaning system 1305 comprises a laser scanning module 1320, a plasma ashing module 1330 and reactive plasma etching module 1340. Susceptors 120 from loading unit 1300 are introduced into laser scanning module 1320 as shown by arrow 1350. In one embodiment, laser 900 of FIG. 9 is configured to scan susceptors 120 to decompose polycrystalline WBG semiconductor material 400 overlying protective layer 210 of FIG. 2 into two or more constituent components on each susceptor. Alternatively, susceptors 120 can be scanned individually by laser 900 of FIG. 9. Laser 900 is configured to decompose polycrystalline WBG semiconductor material on each susceptor leaving polycrystalline WBG semiconductor layer 950 of FIG. 9 on each susceptor as described in FIGS. 1-12. After scanning susceptors 120 with laser 900 in laser scanning module 1320, susceptors 120 are transferred to plasma ashing module 1330 as shown by arrow 1355. In general, no order in a use of the plasma modules is implied as each is used to remove one or more of the constituent components. There can also be more than two plasma modules required depending on the number of constituent components in decomposed polycrystalline WBG semiconductor layer 950 after being scanned by laser 900. In plasma ashing module 1330, plasma 1000 of FIG. 10 is used to etch a constituent component of decomposed polycrystalline WBG semiconductor layer 950 of FIG. 9 leaving residual layer 1050 of FIG. 10 as described in FIGS. 1-12. After treating susceptors 120 in plasma ashing module 1330 leaving residual layer 1050 of FIG. 10 as described in FIGS. 1-12, susceptors 120 are transferred to reactive plasma etching module 1340 as shown by arrow 1360. In reactive plasma etching module 1340, residual layer 1050 of FIG. 10 is removed by etching in reactive plasma 1100 of FIG. 11 as described in FIGS. 1-12. This completes one cycle of treatment of cleaning one or more susceptors 120 using laser scanning module 1320, plasma ashing module 1330 and reactive plasma etching module 1340. If susceptors 120 comprise residual thicknesses of polycrystalline WBG semiconductor material 400 of FIG. 4 overlying protective layer 210 of FIG. 2 as described in FIGS. 1-12, the cycle of laser scanning, ashing, and reactive plasma etching is repeated as shown by arrow 1365. When susceptors 120 are cleaned the one or more layers of polycrystalline WBG semiconductor material 400 of FIG. 4 overlying protective layer 210 of FIG. 2 have been completely removed from susceptors 120. The susceptors 120 that have been cleaned are then unloaded and transferred to an unloading module 1380 as shown by arrow 1370. In FIG. 13, unloading module 1380 is used to transfer susceptors 120 that have been cleaned and refurbished. It should be noted that plasma ashing module 1330 and plasma etching module 1340 can be other module types for removing a specific constituent component that was decomposed by laser 900.

Figure 14:
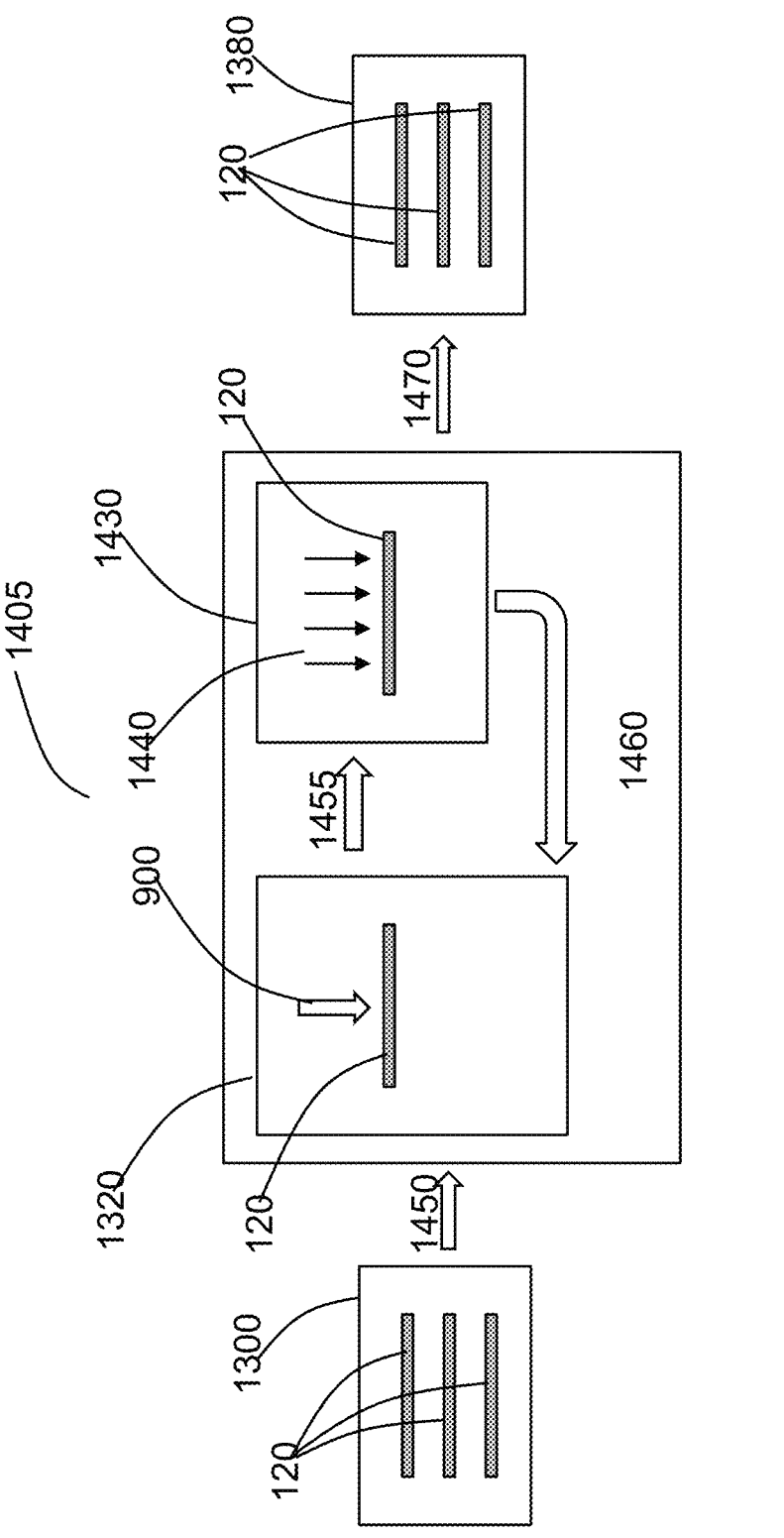
FIG. 14 is an illustration of a susceptor refurbishing system with a separate module for laser scanning and an integrated module for plasma etching of one or more susceptors in accordance with an example embodiment.

FIG. 14 is an illustration of an alternate embodiment of a susceptor refurbishing system 1405 using the optical cleaning method described in FIG. 1-12 in accordance with an example embodiment. In one embodiment, susceptor refurbishing system 1405 comprises loading unit 1300 of FIG. 13 having susceptors 120. In one embodiment, loading unit 1300 could have a single susceptor. Each susceptor 120 has a buildup of one or more layers of WBG semiconductor material that is cleaned as described in FIGS. 1-12.

In one embodiment, susceptor cleaning system 1405 comprises laser scanning module 1320 of FIG. 13 and a module 1430 for plasma ashing and reactive plasma etching. In general, module 1430 is configured to remove the constituent components that have been decomposed in laser scanning module 1320. Susceptor cleaning system 1405 is configured to clean susceptors 120 in a batch mode after multiple cycles of polycrystalline WBG semiconductor material growth on susceptors 120 is formed using epitaxial reactor 100 as described in FIGS. 1-12.

Susceptors 120 from loading unit 1300 are introduced into laser scanning module 1320 as shown by arrow 1450. Laser 900 is used to scan one or more susceptors 120 to decompose polycrystalline WBG semiconductor material 400 of as shown in FIG. 4 overlying protective layer 210 of FIG. 2 into two or more constituent components comprising decomposed polycrystalline WBG semiconductor layer 950 as described in FIGS. 1-12.

After scanning susceptors 120 with laser 900 in laser scanning module 1320, susceptors 120 are configured to be transferred to module 1430 as shown by arrow 1455. In module 1430, susceptors 120 are etched by reactive plasma gases 1440 using plasma etching. In one embodiment, plasma gases 1440 are configured for plasma ashing and reactive plasma etching to remove decomposed polycrystalline WBG semiconductor material 400 as described in FIGS. 1-12. After etching susceptors 120 in module 1430, the cleaning cycle is repeated by transferring susceptors 120 to laser scanning module 1320 as shown by arrow 1460 until all of polycrystalline WBG semiconductor material 400 is removed from susceptors 120. When susceptors 120 are cleaned, they are unloaded and transferred to an unloading module 1380 as shown by arrow 1470. Unloading module 1380 is used to transfer one or more susceptors 120 after being cleaned and refurbished for reuse within an epitaxial reactor.

Figure 15:
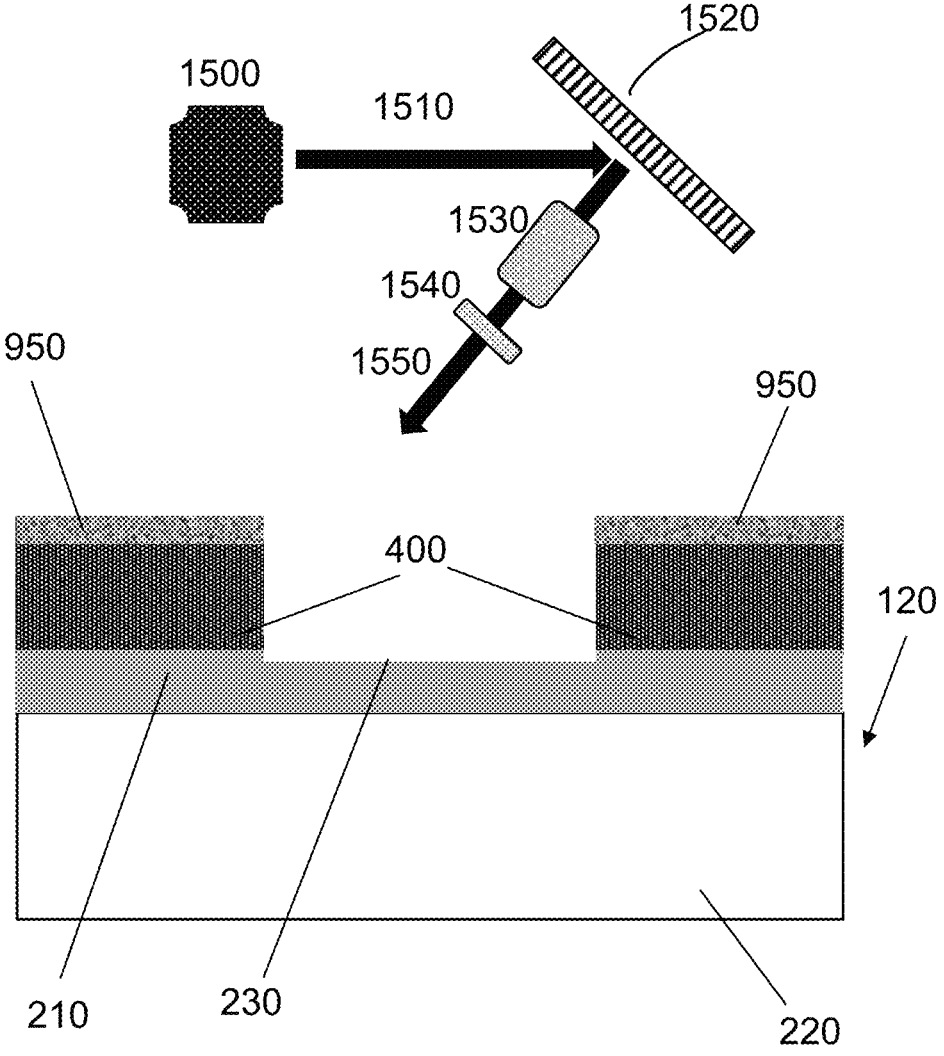
FIG. 15 is an illustration of an alternate embodiment for laser scanning of the susceptor using a laser source with a Galvo scanning mirror in accordance with an example embodiment.

FIG. 15 is an illustration of an alternate embodiment for laser scanning of susceptor 120 using a laser source with a Galvo scanning mirror in accordance with an example embodiment. In one embodiment, a laser source 1500 is used with a scanning mirror 1520 to couple energy to one or more layers of polycrystalline WBG semiconductor material 400 of FIG. 4 overlying protective layer 210 of susceptor 120 of FIG. 4 to support the cleaning process as disclosed in FIGS. 1-12. Laser source 1500 produces an incident laser beam 1510 which is reflected by scanning mirror 1520 through a collimating system 1530 and focusing lens 1540 to produce a reflected laser beam 1550. The laser energy from laser source 1500 is used to decompose one or more layers of polycrystalline WBG semiconductor material 400 of FIG. 4 into two or more constituent components and forming decomposed polycrystalline WBG semiconductor layer 950 of FIG. 9. Laser source 1500 may be of different wavelengths depending on the material being scanned and may be used in continuous wave (CW) or pulsed wave (PW) mode. The scan rate and direction may be controlled by a computer such that the energy coupled to polycrystalline WBG semiconductor material 400 of FIG. 4 is determined. In one embodiment, polycrystalline WBG semiconductor material 400 of FIG. 4 comprises silicon carbide and laser source 1500 has a wavelength of 1064 nm and is used in pulsed mode.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

The descriptions disclosed herein below will call out components, materials, inputs, or outputs from FIGS. 1-15. In one embodiment, a susceptor 120 is configured to hold one or more or more WBG (Wide Bandgap) semiconductor wafers 150 for epitaxial layer growth to support a manufacture of at least one WBG (Wide Bandgap) semiconductor device 700 wherein susceptor 120 has a protective layer 210, one or more layers of polycrystalline WBG semiconductor material 400 overlying portions of protective layer 210 of susceptor 120 and a laser 900 configured to scan one or more layers of polycrystalline WBG semiconductor material 400 overlying portions of protective layer 210 of susceptor 120 wherein laser 900 is configured to decompose one or more layers of polycrystalline WBG semiconductor material 400 and wherein one or more decomposed layers polycrystalline WBG semiconductor material 950 is removed from suscep- tor 120.

In one embodiment, protective layer 210 of susceptor 120 comprises a Tantalum Carbide layer and wherein one more layers of polycrystalline WBG semiconductor material 400 comprises polycrystalline silicon carbide.

In one embodiment, susceptor 120 is scanned with laser 900 wherein a wavelength of the laser comprises one of 1064 nm and wherein energy from laser 900 is configured to be substantially absorbed by the polycrystalline silicon carbide.

In one embodiment, susceptor 120 is scanned with laser 900 wherein laser 900 is configured to decompose the polycrystalline silicon carbide into silicon and carbon, wherein the carbon is configured to be removed using plasma ashing and silicon is configured to be removed by etching.

In one embodiment, susceptor 120 is configured such that a Galvo scanning mirror is configured to scan the one or more layers of polycrystalline silicon carbide overlying susceptor 120.

In one embodiment, susceptor 120 is configured such that a thickness of polycrystalline WBG semiconductor material 400 is monitored during an epitaxial growth wherein susceptor 120 is removed from epitaxial reactor 100 when the thickness of the one or more layers of polycrystalline WBG semiconductor material 400 is above or equal to a prede- termined thickness.

In one embodiment, susceptor 120 is configured such that a wavelength of laser 900 is configured to be substantially transparent to protective layer 210 of susceptor 120 and wherein energy from laser 900 is configured to be absorbed by one or more layers of polycrystalline WBG semiconduc- tor material 400 overlying portions of protective layer 210 of susceptor 120.

In one embodiment, susceptor 120 is configured such that the one or more layers of decomposed polycrystalline WBG semiconductor material 950 comprises two or more con- stituent components and wherein the two or more constitu- ent components are removed by a semiconductor etching process.

In one embodiment, susceptor 120 is configured wherein a process of scanning one or more layers of polycrystalline WBG semiconductor material 400 overlying portions of protective layer 210 of susceptor 120 and a process of etching the two or more constituent components is config- ured to be repeated until protective layer 210 of susceptor 120 is exposed.

In one configuration, susceptor 120 further includes a layer overlying protective layer 210 and wherein the layer is configured to support the removal of the one or more layers of polycrystalline WBG semiconductor material 400 over- lying portions of protective layer 210 of susceptor 120.

In one embodiment, susceptor 120 is configured wherein cleaned susceptor 120 comprises all of the one or more layers of polycrystalline WBG material 400 being removed from susceptor 120, wherein cleaned susceptor 120 is con- figured to be used in epitaxial reactor 100, and wherein one or more devices are manufactured on one or more wafers having at least one epitaxial layers grown on cleaned sus- ceptor 120.

In one embodiment, susceptor 120 is configured such that the laser scanning and removing the one or more layers of polycrystalline WBG semiconductor material 400 overlying portions of protective layer 210 of susceptor 120 occurs in at least two modules.

In one embodiment, susceptor 120 is configured such that more than one susceptor 120 is scanned by laser 900.

In one embodiment, susceptor 120 is configured to hold one or more WBG (Wide Bandgap) semiconductor wafers 150 for epitaxial layer growth to support a manufacture of at least one WBG (Wide Bandgap) semiconductor device 700 wherein susceptor 120 is cleaned by a method comprising scanning laser 900 over a surface of susceptor 120 wherein susceptor 120 has one or more layers of polycrystalline WBG semiconductor material 400 formed thereon from being used in epitaxial reactor 100 wherein energy of laser 900 is configured to be absorbed by the one or more layers of polycrystalline WBG semiconductor material 400 to decompose the one or more layers of polycrystalline WBG semiconductor material 400 into two or more constituent components; and etching the two or more constituent com- ponents from susceptor 120 to remove the two or more constituent components from susceptor 120.

In one embodiment, susceptor 120 is configured wherein a process of scanning laser 900 and etching the two or more constituent components is repeated until the one or more layers of polycrystalline WBG semiconductor material 400 is removed to form a cleaned susceptor 120, wherein the cleaned susceptor 120 is used for epitaxial growth on one or more WBG semiconductor wafers 150, and wherein one or more devices are formed on the one or more WBG semi- conductor wafers 150 having the epitaxial growth from the cleaned susceptor. 120.

In one embodiment, susceptor 120 is configured to hold one or more WBG (Wide Bandgap) semiconductor wafers 150 for epitaxial layer growth to support a manufacture of at least one WBG (Wide Bandgap) semiconductor device 700 comprising susceptor 120 wherein susceptor 120 has protective layer 210 comprising tantalum carbide (TaC), one or more layers of polycrystalline silicon carbide material overlying portions of susceptor 120, laser 900 configured to scan the one or more layers of polycrystalline silicon carbide material wherein energy from laser 900 is configured to decompose the one or more layers of polycrystalline silicon carbide material into silicon and carbon, wherein the carbon is removed from susceptor 120, wherein the silicon is removed from susceptor 120, wherein a cleaned susceptor 120 comprises removing the one or more layers of polycrystalline silicon carbide material from susceptor 120, wherein cleaned susceptor 120 is used for epitaxial growth on one or more WBG semiconductor wafers 150, and wherein one or more devices are formed on the one or more WBG semiconductor wafers 150 having the epitaxial growth from cleaned susceptor 120.

What is claimed:

1. A susceptor refurbishing system configured to clean one or more susceptors wherein each susceptor is configured to hold one or more WBG (Wide Bandgap) semiconductor wafers comprising:
   a loading unit configured to hold one or more susceptors, wherein a surface of each susceptor of the one or more susceptors has a protective layer and wherein the one or more susceptors have one or more layers of polycrystalline WBG material on or overlying the protective layer from wafer processing in an WBG epitaxial reactor;
   a laser scanning module including
   one or more lasers configured to scan surfaces of the one or more susceptors, wherein the loading unit is configured to couple to and provide the one or more susceptors to the laser scanning module, wherein the one or more lasers is configured to decompose the one or more layers of polycrystalline WBG semiconductor material into at least two elemental components, and wherein at least one of the at least two elemental components remains coupled to the protective layer; and
   at least one material removal module, wherein the one or more susceptors are configured to be transferred from the laser scanning module to the at least one removal module and wherein the at least one material removal process module is configured to remove the at least one of the two elemental components by at least one of plasma ashing, plasma etching, etching, or wet chemistry removal.

2. The system of claim 1, wherein the protective layer of the one or more susceptors comprises a Tantalum Carbide layer.

3. The system of claim 1, wherein the one more layers of polycrystalline WBG semiconductor material comprises polycrystalline silicon carbide.

4. The system of claim 3, wherein a wavelength of the one or more lasers is 1064 nanometer.

5. The system of claim 3, wherein the one or more lasers is configured to decompose the polycrystalline silicon carbide into silicon and carbon and wherein the silicon and the carbon remains coupled to the protective surface of each susceptor of the one or more susceptors.

6. The system of claim 5, wherein the one or more susceptors are transferred into a plasma ashing module configured to remove one of the silicon or the carbon by exposure to a plasma.

7. The system of claim 6, wherein the plasma ashing module is configured to expose the silicon and carbon overlying the protective layer of the one or more susceptors to plasma comprising oxygen that etches carbon thereby leaving a residual layer of silicon.

8. The system of claim 7, wherein the plasma ashing module is configured to expose the silicon and carbon overlying the protective layer of the one or more susceptors to plasma comprising oxygen and argon that etches carbon thereby leaving a residual layer of silicon.

9. The system of claim 5, wherein the one or more susceptors are transferred into a dry ashing module configured to remove the carbon.

10. The system of claim 7, wherein the one or more susceptors are transferred from the plasma ashing module to a plasma etching module.

11. The system of claim 10, wherein the plasma etching module is configured to remove a residual layer of silicon overlying the protective layer of the one or more susceptors.

12. The system of claim 11, wherein the plasma etching module is configured to expose the residual layer of silicon overlying the protective layer of the one or more susceptors to a reactive plasma comprising sulfur hexafluoride (SF6) thereby etching the silicon from the protective layer of the one or more susceptors.

13. The system of claim 11, wherein a material removal cycle comprises the one or more susceptors being processed by the laser scanning module, the plasma ashing module, and the plasma etching module and wherein the material removal cycle can be repeated until the elemental components of silicon and carbon are removed overlying the protective layer of the one or more susceptors.

14. The system of claim 9, wherein the one or more susceptors are transferred from the plasma ashing module to a wet etching module and wherein the residual layer of silicon is etched from the protective layer of the one or more susceptors using KOH (potassium hydroxide), TMAH (Tetra Methyl Ammonium Hydroxide), acetic acid, hydrofluoric acid (HF), or nitric acid.

15. The system of claim 1, wherein the one or more lasers decompose polycrystalline WBG material within a predetermined spot size of the one or more lasers.

16. The system of claim 15, wherein the one or more lasers is pulsed and is configured to supply energy to decompose the polycrystalline WBG material overlying the protective layer of the one or more susceptors at a predetermined scan rate.

17. The system of claim 1, wherein the protective layer is capable of withstanding heat from the one or more lasers, plasma ashing, plasma etching, etching, or wet chemistry removal.

18. A susceptor refurbishing system configured to clean one or more susceptors wherein each susceptor is configured to hold one or more WBG (Wide Bandgap) semiconductor wafers comprising:
   a loading unit configured to hold one or more susceptors, wherein a surface of each susceptor of the one or more susceptors has a protective layer comprising tantalum carbide (TaC) and wherein the one or more susceptors have one or more layers of polycrystalline silicon carbide material overlying portions of the protective layer of the one or more susceptors;

a laser scanning module including one or more lasers configured to scan the one or more layers of polycrystalline silicon carbide material overlying the protective layer of the one or more susceptors, wherein the loading unit is configured to couple to and provide the one or more susceptors to the laser scanning module, wherein the one or more lasers is configured to deliver energy of a predetermined spot size at a predetermined scan rate to decompose the one or more layers of polycrystalline silicon carbide material into elemental components of silicon and carbon along a scan path of the one or more lasers, and wherein the silicon and the carbon is coupled to the protective layer;

an ashing module configured to remove carbon, wherein the one or more susceptors are transferred into the ashing module and wherein the ashing module is configured to expose the silicon and the carbon overlying the protective layer of the one or more susceptors to plasma ashing or dry ashing thereby etching the carbon and leaving a residual layer of silicon; and an etching module configured to remove silicon, wherein the one or more susceptors are transferred to the etching module and wherein the etching module is configured to expose the residual layer of silicon overlying the protective layer of the one or more susceptors to plasma etching or wet etching such that the residual layer of silicon on or overlying the protective layer of the one or more susceptors is removed.

\* \* \* \* \*